US 9,450,744 B2

(12) United States Patent
Simpson et al.

(10) Patent No.: US 9,450,744 B2
(45) Date of Patent: Sep. 20, 2016

(54) CONTROL LOOP MANAGEMENT AND VECTOR SIGNALING CODE COMMUNICATIONS LINKS

(71) Applicant: Kandou Labs S.A., Lausanne (CH)

(72) Inventors: Richard Simpson, Bedford (GB); Roger Ulrich, Bern (CH)

(73) Assignee: KANDOU LAB, S.A. (CH)

( * ) Notice: Subject to any disclaimer, the term of this patent is extended or adjusted under 35 U.S.C. 154(b) by 0 days.

(21) Appl. No.: 14/717,717

(22) Filed: May 20, 2015

(65) Prior Publication Data

US 2015/0256326 A1    Sep. 10, 2015

Related U.S. Application Data

(63) Continuation-in-part of application No. 13/839,094, filed on Mar. 15, 2013, now Pat. No. 9,059,816.

(51) Int. Cl.
| | |
|---|---|
| *H04L 27/06* | (2006.01) |
| *H04L 7/00* | (2006.01) |
| *H04L 1/00* | (2006.01) |
| *H04L 25/03* | (2006.01) |

(52) U.S. Cl.
CPC .......... *H04L 7/0025* (2013.01); *H04L 1/0001* (2013.01); *H04L 1/0045* (2013.01); *H04L 1/0057* (2013.01); *H04L 7/00* (2013.01); *H04L 25/03* (2013.01); *H04L 2001/0094* (2013.01)

(58) Field of Classification Search
CPC . H04L 7/0025; H04L 1/0001; H04L 1/0045; H04L 1/0057; H04L 7/00; H04L 25/03; H04L 2001/0094
See application file for complete search history.

(56) References Cited

U.S. PATENT DOCUMENTS

| | | |
|---|---|---|
| 3,196,351 A | 7/1965 | Slepian |
| 3,636,463 A | 1/1972 | Ongkiehong |
| 3,939,468 A | 2/1976 | Mastin |
| 4,163,258 A | 7/1979 | Ebihara et al. |
| 4,181,967 A | 1/1980 | Nash |
| 4,206,316 A | 6/1980 | Burnsweig |
| 4,276,543 A | 6/1981 | Miller |
| 4,486,739 A | 12/1984 | Franaszek |
| 4,499,550 A | 2/1985 | Ray, III |
| 4,774,498 A | 9/1988 | Traa |
| 4,864,303 A | 9/1989 | Ofek |
| 4,897,657 A | 1/1990 | Brubaker |

(Continued)

FOREIGN PATENT DOCUMENTS

WO    2010031824    3/2010

OTHER PUBLICATIONS

Slepian, Permutation Modulation, IEEE, vol. 53, No. 3, Mar. 1965, pp. 228-236.

(Continued)

*Primary Examiner* — Dac Ha
(74) *Attorney, Agent, or Firm* — Invention Mine LLC

(57) ABSTRACT

Vector signaling code communications systems rely on group transmission of code symbols using multiple signaling channels that must be actively monitored and adjusted to minimize differential signal characteristics. Information obtained during receive detection may be analyzed to identify channel operational characteristics during normal operation and perform non-disruptive channel adjustments. Initialization or start-up adjustment may also be performed using intentionally transmitted patterns.

20 Claims, 8 Drawing Sheets

(56) References Cited

U.S. PATENT DOCUMENTS

| | | |
|---|---|---|
| 4,974,211 A | 11/1990 | Corl |
| 5,053,974 A | 10/1991 | Penz |
| 5,166,956 A | 11/1992 | Baltus et al. |
| 5,168,509 A | 12/1992 | Nakamura |
| 5,283,761 A | 2/1994 | Gillingham |
| 5,287,305 A | 2/1994 | Yoshida |
| 5,412,689 A | 5/1995 | Chan et al. |
| 5,449,895 A | 9/1995 | Hecht |
| 5,459,465 A | 10/1995 | Kagey |
| 5,511,119 A | 4/1996 | Lechleider |
| 5,553,097 A | 9/1996 | Dagher |
| 5,599,550 A | 2/1997 | Kohlruss |
| 5,659,353 A | 8/1997 | Kostreski |
| 5,802,356 A | 9/1998 | Gaskins |
| 5,809,430 A | 9/1998 | D'Amico |
| 5,825,808 A | 10/1998 | Hershey et al. |
| 5,875,202 A | 2/1999 | Venters |
| 5,945,935 A | 8/1999 | Kusumoto |
| 5,995,016 A | 11/1999 | Perino |
| 6,005,895 A | 12/1999 | Perino et al. |
| 6,084,883 A | 7/2000 | Norrell |
| 6,119,263 A | 9/2000 | Mowbray et al. |
| 6,172,634 B1 | 1/2001 | Leonowich |
| 6,175,230 B1 | 1/2001 | Hamblin |
| 6,232,908 B1 | 5/2001 | Nakaigawa |
| 6,278,740 B1 | 8/2001 | Nordyke |
| 6,346,907 B1 | 2/2002 | Dacy |
| 6,359,931 B1 | 3/2002 | Perino et al. |
| 6,404,820 B1 | 6/2002 | Postol |
| 6,417,737 B1 | 7/2002 | Moloudi |
| 6,452,420 B1 | 9/2002 | Wong |
| 6,483,828 B1 | 11/2002 | Balachandran |
| 6,504,875 B2 | 1/2003 | Perino |
| 6,509,773 B2 | 1/2003 | Buchwald et al. |
| 6,556,628 B1 | 4/2003 | Poulton et al. |
| 6,563,382 B1 | 5/2003 | Yang |
| 6,621,427 B2 | 9/2003 | Greenstreet |
| 6,624,699 B2 | 9/2003 | Yin |
| 6,650,638 B1 | 11/2003 | Walker |
| 6,661,355 B2 | 12/2003 | Cornelius et al. |
| 6,766,342 B2 | 7/2004 | Kechriotis |
| 6,839,429 B1 | 1/2005 | Gaikwad et al. |
| 6,839,587 B2 | 1/2005 | Yonce |
| 6,865,234 B1 | 3/2005 | Agazzi |
| 6,865,236 B1 | 3/2005 | Terry |
| 6,954,492 B1 | 10/2005 | Williams |
| 6,990,138 B2 | 1/2006 | Bejjani et al. |
| 6,999,516 B1 | 2/2006 | Rajan |
| 7,023,817 B2 | 4/2006 | Kuffner |
| 7,053,802 B2 | 5/2006 | Cornelius |
| 7,085,153 B2 | 8/2006 | Ferrant |
| 7,142,612 B2 | 11/2006 | Horowitz et al. |
| 7,142,865 B2 | 11/2006 | Tsai |
| 7,167,019 B2 | 1/2007 | Broyde et al. |
| 7,180,949 B2 | 2/2007 | Kleveland et al. |
| 7,184,483 B2 | 2/2007 | Rajan |
| 7,269,212 B1 | 9/2007 | Chau |
| 7,335,976 B2 | 2/2008 | Chen |
| 7,356,213 B1 | 4/2008 | Cunningham |
| 7,358,869 B1 | 4/2008 | Chiarulli et al. |
| 7,362,130 B2 | 4/2008 | Broyde et al. |
| 7,389,333 B2 | 6/2008 | Moore et al. |
| 7,428,273 B2 | 9/2008 | Foster |
| 7,456,778 B2 | 11/2008 | Werner |
| 7,462,956 B2 | 12/2008 | Lan |
| 7,570,704 B2 | 8/2009 | Nagarajan |
| 7,633,850 B2 | 12/2009 | Ahn |
| 7,643,588 B2 | 1/2010 | Visalli |
| 7,656,321 B2 | 2/2010 | Wang |
| 7,697,915 B2 | 4/2010 | Behzad |
| 7,706,524 B2 | 4/2010 | Zerbe |
| 7,746,764 B2 | 6/2010 | Rawlins et al. |
| 7,787,572 B2 | 8/2010 | Scharf |
| 7,841,909 B2 | 11/2010 | Murray |
| 7,869,497 B2 | 1/2011 | Benvenuto |
| 7,882,413 B2 | 2/2011 | Chen |
| 7,933,770 B2 | 4/2011 | Kruger et al. |
| 8,050,332 B2 | 11/2011 | Chung et al. |
| 8,064,535 B2 | 11/2011 | Wiley |
| 8,091,006 B2 | 1/2012 | Prasad et al. |
| 8,106,806 B2 | 1/2012 | Toyomura |
| 8,159,375 B2 | 4/2012 | Abbasfar |
| 8,159,376 B2 | 4/2012 | Abbasfar |
| 8,185,807 B2 | 5/2012 | Oh |
| 8,199,849 B2 | 6/2012 | Oh |
| 8,204,014 B2 | 6/2012 | Mondal et al. |
| 8,218,670 B2 | 7/2012 | Abou Rjeily |
| 8,253,454 B2 | 8/2012 | Lin |
| 8,279,094 B2 | 10/2012 | Abbasfar |
| 8,295,250 B2 | 10/2012 | Gorokhov |
| 8,310,389 B1 | 11/2012 | Chui |
| 8,406,315 B2 | 3/2013 | Tsai |
| 8,429,495 B2 | 4/2013 | Przybylski |
| 8,442,099 B1 | 5/2013 | Sederat |
| 8,442,210 B2 | 5/2013 | Zerbe |
| 8,443,223 B2 | 5/2013 | Abbasfar |
| 8,462,891 B2 | 6/2013 | Kizer |
| 8,498,368 B1 | 7/2013 | Husted |
| 8,520,493 B2 | 8/2013 | Goulahsen |
| 8,539,318 B2 | 9/2013 | Cronie et al. |
| 8,547,272 B2 | 10/2013 | Nestler |
| 8,578,246 B2 | 11/2013 | Mittelholzer |
| 8,588,280 B2 | 11/2013 | Oh |
| 8,593,305 B1 | 11/2013 | Tajalli |
| 8,601,338 B2 | 12/2013 | Kolze |
| 8,638,241 B2 | 1/2014 | Sudhakaran |
| 8,649,445 B2 | 2/2014 | Cronie et al. |
| 8,649,460 B2 | 2/2014 | Ware et al. |
| 8,649,840 B2 | 2/2014 | Sheppard, Jr. |
| 8,780,687 B2 | 7/2014 | Clausen |
| 8,782,578 B2 | 7/2014 | Tell |
| 8,879,660 B1 | 11/2014 | Peng |
| 8,949,693 B2 | 2/2015 | Ordentlich |
| 8,951,072 B2 | 2/2015 | Hashim |
| 8,989,317 B1 | 3/2015 | Holden |
| 9,036,764 B1 | 5/2015 | Hossain |
| 9,069,995 B1 | 6/2015 | Cronie |
| 9,077,386 B1 | 7/2015 | Holden |
| 9,093,791 B2 | 7/2015 | Liang |
| 9,100,232 B1 | 8/2015 | Hormati |
| 9,106,238 B1* | 8/2015 | Cronie ............... H03M 7/00 |
| 9,106,465 B2 | 8/2015 | Walter |
| 9,143,362 B2* | 9/2015 | Wiley ............... H04L 25/02 |
| 9,281,785 B2 | 3/2016 | Sjoland |
| 9,331,962 B2 | 5/2016 | Lida |
| 9,362,974 B2 | 6/2016 | Fox |
| 2001/0006538 A1 | 7/2001 | Simon |
| 2001/0055344 A1 | 12/2001 | Lee |
| 2002/0034191 A1 | 3/2002 | Shattil |
| 2002/0044316 A1 | 4/2002 | Myers |
| 2002/0057592 A1 | 5/2002 | Robb |
| 2002/0154633 A1 | 10/2002 | Shin |
| 2002/0163881 A1 | 11/2002 | Dhong |
| 2002/0174373 A1 | 11/2002 | Chang |
| 2003/0048210 A1 | 3/2003 | Kiehl |
| 2003/0071745 A1 | 4/2003 | Greenstreet |
| 2003/0105908 A1 | 6/2003 | Perino |
| 2003/0146783 A1 | 8/2003 | Bandy |
| 2003/0227841 A1 | 12/2003 | Tateishi |
| 2004/0003336 A1 | 1/2004 | Cypher |
| 2004/0003337 A1 | 1/2004 | Cypher |
| 2004/0057525 A1 | 3/2004 | Rajan |
| 2004/0086059 A1 | 5/2004 | Eroz |
| 2004/0156432 A1* | 8/2004 | Hidaka ............. H04L 25/03057 375/233 |
| 2004/0174373 A1 | 9/2004 | Stevens |
| 2005/0057379 A1 | 3/2005 | Jansson |
| 2005/0135182 A1 | 6/2005 | Perino |
| 2005/0149833 A1 | 7/2005 | Worley |
| 2005/0152385 A1 | 7/2005 | Cioffi |
| 2005/0174841 A1 | 8/2005 | Ho |
| 2005/0213686 A1 | 9/2005 | Love |
| 2005/0286643 A1 | 12/2005 | Ozawa |
| 2006/0018344 A1 | 1/2006 | Pamarti |

(56) References Cited

U.S. PATENT DOCUMENTS

| | | | |
|---|---|---|---|
| 2006/0115027 A1* | 6/2006 | Srebranig | H03G 3/3052 375/345 |
| 2006/0133538 A1 | 6/2006 | Stojanovic | |
| 2006/0159005 A1 | 7/2006 | Rawlins | |
| 2006/0269005 A1 | 11/2006 | Laroia | |
| 2007/0030796 A1 | 2/2007 | Green | |
| 2007/0188367 A1 | 8/2007 | Yamada | |
| 2007/0260965 A1 | 11/2007 | Schmidt | |
| 2007/0263711 A1 | 11/2007 | TheodorKramer | |
| 2007/0283210 A1 | 12/2007 | Prasad | |
| 2008/0086670 A1 | 4/2008 | Krouk et al. | |
| 2008/0104374 A1 | 5/2008 | Mohamed | |
| 2008/0169846 A1 | 7/2008 | Lan | |
| 2008/0273623 A1 | 11/2008 | Chung | |
| 2008/0284524 A1 | 11/2008 | Kushiyama | |
| 2009/0059782 A1 | 3/2009 | Cole | |
| 2009/0063292 A1 | 3/2009 | Cole | |
| 2009/0092196 A1 | 4/2009 | Okunev | |
| 2009/0132758 A1 | 5/2009 | Jiang | |
| 2009/0154500 A1 | 6/2009 | Diab | |
| 2009/0185636 A1 | 7/2009 | Palotai | |
| 2009/0193159 A1 | 7/2009 | Li | |
| 2009/0212861 A1 | 8/2009 | Lim | |
| 2009/0257542 A1 | 10/2009 | Evans | |
| 2010/0020898 A1 | 1/2010 | Stojanovic | |
| 2010/0046644 A1 | 2/2010 | Mazet | |
| 2010/0104047 A1 | 4/2010 | Chen | |
| 2010/0177816 A1 | 7/2010 | Malipatil | |
| 2010/0180143 A1 | 7/2010 | Ware | |
| 2010/0205506 A1 | 8/2010 | Hara | |
| 2010/0296550 A1 | 11/2010 | Abou Rjeily | |
| 2010/0296556 A1 | 11/2010 | Rave | |
| 2011/0014865 A1 | 1/2011 | Seo | |
| 2011/0051854 A1 | 3/2011 | Kizer | |
| 2011/0084737 A1 | 4/2011 | Oh | |
| 2011/0127990 A1 | 6/2011 | Wilson | |
| 2011/0235501 A1 | 9/2011 | Goulahsen | |
| 2011/0268225 A1 | 11/2011 | Cronie | |
| 2011/0299555 A1 | 12/2011 | Cronie | |
| 2011/0302478 A1 | 12/2011 | Cronie | |
| 2011/0317559 A1 | 12/2011 | Kern | |
| 2012/0063291 A1 | 3/2012 | Hsueh | |
| 2012/0152901 A1 | 6/2012 | Nagorny | |
| 2012/0161945 A1 | 6/2012 | Single | |
| 2012/0213299 A1 | 8/2012 | Cronie | |
| 2012/0257683 A1 | 10/2012 | Schwager | |
| 2013/0010892 A1 | 1/2013 | Cronie | |
| 2013/0051162 A1 | 2/2013 | Amirkhany | |
| 2013/0163126 A1 | 6/2013 | Dong | |
| 2013/0259113 A1 | 10/2013 | Kumar | |
| 2014/0016724 A1 | 1/2014 | Cronie | |
| 2014/0132331 A1 | 5/2014 | Gonzalez Diaz | |
| 2014/0198837 A1 | 7/2014 | Fox | |
| 2014/0226455 A1 | 8/2014 | Schumacher | |
| 2014/0254730 A1 | 9/2014 | Kim | |
| 2015/0010044 A1* | 1/2015 | Zhang | H03D 3/02 375/219 |
| 2015/0078479 A1 | 3/2015 | Whitby-Strevens | |
| 2015/0199543 A1 | 7/2015 | Winoto | |
| 2015/0333940 A1 | 11/2015 | Shokrollahi | |
| 2015/0381232 A1 | 12/2015 | Ulrich | |
| 2016/0020796 A1 | 1/2016 | Hormati | |
| 2016/0020824 A1 | 1/2016 | Ulrich | |
| 2016/0036616 A1 | 2/2016 | Holden | |

OTHER PUBLICATIONS

International Search Report and Written Opinion for PCT/EP2011/002170 mailed Jul. 14, 2011.

Stan et al., Bus-Invert Coding for Low-Power I/O, IEEE Transactions on Very Large Scale Integration (VLSI) Systems, vol. 3, No. 1, Mar. 1995, pp. 49-58.

Tallini et al., Transmission Time Analysis for the Parallel Asynchronous Communication Scheme, IEEE Transactions on Computers, vol. 52, No. 5, May 2003, pp. 558-571.

International Search Report and Written Opinion for PCT/EP2012/052767 mailed May 11, 2012.

International Search Report and Written Opinion for PCT/EP2011/074219 mailed Jul. 4, 2012.

International Search Report and Written Opinion for PCT/EP2011/059279 mailed Sep. 22, 2011.

Burr, Spherical Codes for M-ARY Code Shift Keying, University of York, Apr. 2, 1989, pp. 67-72, United Kingdom.

Ericson et al., Spherical Codes Generated by Binary Partitions of Symmetric Pointsets, IEEE Transactions on Information Theory, vol. 41, No. 1, Jan. 1995, pp. 107-129.

Farzan et al., Coding Schemes for Chip-to-Chip Interconnect Applications, IEEE Transactions on Very Large Scale Integration (VLSI) Systems, vol. 14, No. 4, Apr. 2006, pp. 393-406.

Abbasfar, A. "Generalized Differential Vector Signaling," IEEE International Conference on Communications, ICC '09, (Jun. 14, 2009), pp. 1-5.

DaSilva, et al., "Multicarrier Othogonal CDMA Signals for Quasi-Synchronous Communications Systems", IEEE Journal on Selected Areas in Communications, vol. 12, No. 5 (Jun. 1, 1994), pp. 842-852.

Wang et al., "Applying CDMA Technique to Network-on-chip," IEEE Transactions on Very Large Scale Integration (VLSI) Systems, Oct. 1, 2007, vol. 15., No. 10, pp. 1091-1100.

International Search Report and Written Opinion of the International Searching Authority, mailed Nov. 5, 2012, in International Patent Application S.N. PCT/EP2012/052767, 7 pages.

Healey, A., et al., "A Comparison of 25 Gbps NRZ & PAM-4 Modulation used in Legacy & Premium Backplane Channels", DesignCon 2012, 16 pages.

International Search Report for PCT/US2014/053563, dated Nov. 11, 2014, 2 pages.

Clayton, P., "Introduction to Electromagnetic Compatibility", Wiley-Interscience, 2006.

She et al., "A Framework of Cross-Layer Superposition Coded Multicast for Robust IPTV Services over WiMAX," IEEE Communications Society subject matter experts for publication in the WCNC 2008 proceedings, Mar. 31, 2008-Apr. 3, 2008, pp. 3139-3144.

Poulton, et al., "Multiwire Differential Signaling", UNC-CH Department of Computer Science Version 1.1, Aug. 6, 2003.

Skliar et al., A Method For the Analysis of Signals: the Square-Wave Method, Mar. 2008, Revista de Matematica: Teoria y Aplicationes, pp. 109-129.

International Search Report and Written Opinion from PCT/US2014/034220 mailed Aug. 21, 2014.

International Search Report and Written Opinion for PCT/US14/052986 mailed Nov. 24, 2014.

Burr, "Spherical Codes for M-ARY Code Shift Keying", University of York, Apr. 2, 1989, pp. 67-72, United Kingdom.

Notification of Transmittal of The International Search Report and The Written Opinion of the International Searching Authority, or The Declaration for PCT/EP2013/002681, dated Feb. 25, 2014, 15 pages.

Brown, L., et al., "V.92: The Last Dial-Up Modem?", IEEE Transactions on Communications, IEEE Service Center, Piscataway, NJ., USA, vol. 52, No. 1, Jan. 1, 2004, pp. 54-61. XP011106836, ISSN: 0090-6779, DOI: 10.1109/tcomm.2003.822168, pp. 55-59.

Notification of Transmittal of International Search Report and The Written Opinion of the International Searching Authority, for PCT/US2015/018363, mailed Jun. 18, 2015, 13 pages.

Counts, L., et al., "One-Chip Slide Rule Works with Logs, Antilogs for Real-Time Processing," Analog Devices Computational Products 6, Reprinted from Electronic Design, May 2, 1985, 7 pages.

Design Brief 208 Using the Anadigm Multiplier CAM, Copyright 2002 Anadigm, 6 pages.

Grahame, J., "Vintage Analog Computer Kits," posted on Aug. 25, 2006 in Classic Computing, 2 pages, http.//www.retrothing.com/2006/08/classic_analog_.html.

Schneider, J., et al., "ELEC301 Project: Building an Analog Computer," Dec. 19, 1999, 8 pages, http://www.clear.rice.edu/elec301/Projects99/anlgcomp/.

(56) References Cited

OTHER PUBLICATIONS

Tierney, J., et al., "A digital frequency synthesizer," Audio and Electroacoustics, IEEE Transactions, Mar. 1971, pp. 48-57, vol. 19, Issue 1, 1 page Abstract from http://ieeexplore.
"Introduction to: Analog Computers and the DSPACE System," Course Material ECE 5230 Spring 2008, Utah State University, www.coursehero.com, 12 pages.
Notification of Transmittal of The International Search Report and The Written Opinion of the International Searching Authority, or the Declaration, for PCT/US2014/015840, dated May 20, 2014. 11 pages.
Notification of Transmittal of The International Search Report and The Written Opinion of the International Searching Authority, or the Declaration, for PCT/US2014/043965, dated Oct. 22, 2014, 10 pages.
Notification of Transmittal of The International Search Report and The Written Opinion of the International Searching Authority, or The Declaration, dated Mar. 3, 2015, for PCT/US2014/066893, 9 pages.
Jiang, A., et al., "Rank Modulation for Flash Memories", IEEE Transactions of Information Theory, Jun. 2006, vol. 55, No. 6, pp. 2659-2673.
Zouhair Ben-Neticha et al, "The 'streTched'-Golay and other codes for high-SNR finite-delay quantization of the Gaussian source at 1/2 Bit per sample, IEEE Transactions on Communications, vol. 38, No. 12 Dec. 1, 1990, pp. 2089-2093, XP000203339, ISSN: 0090-6678, DOI: 10.1109/26.64647.
Oh, et al., Pseudo-Differential Vector Signaling for Noise Reduction in Single-Ended Ended Signaling, DesignCon 2009.
Loh, M., et al., "A 3×9 Gb/s Shared, All-Digital CDR for High-Speed, High-Density I/O", Matthew Loh, IEEE Journal of Solid-State Circuits, Vo. 47, No. 3, Mar. 2012.
Notification of Transmittal of the International Search Report and The Written Opinion of the International Searching Authority, or the Declaration, for PCT/US2015/039952, dated Sep. 23, 2015, 8 pages.
Notification of Transmittal of the International Search Report and the Written Opinion of the International Searching Authority, or the Declaration, for PCT/US2015/041161, dated Oct. 7, 2015, 8 pages.
Notification of Transmittal of the International Search Report and the Written Opinion of the International Searching Authority, or the Declaration, for PCT/US2015/043463, dated Oct. 16, 2015, 8 pages.
Notification of Transmittal of the International Search Report and the Written Opinion of the International Searching Authority, or the Declaration, for PCT/US2015/037466, dated Nov. 19, 2015.

\* cited by examiner

CONTROL LOOP MANAGEMENT AND VECTOR SIGNALING CODE COMMUNICATIONS LINKS

This application is a Continuation-in-Part of U.S. application Ser. No. 13/839,094, filed Mar. 15, 2013, naming Richard Simpson and Roger Ulrich, entitled "Control Loop Management and Differential Delay Correction for Vector Signaling Code Communications Links".

CROSS-REFERENCES TO RELATED APPLICATIONS

The following prior applications are herein incorporated by reference in their entirety for all purposes:

U.S. Patent Publication 2011/0268225 of application Ser. No. 12/784,414, filed May 20, 2010, naming Harm Cronie and Amin Shokrollahi, entitled "Orthogonal Differential Vector Signaling" (hereinafter "Cronie I").

U.S. Patent Publication 2011/0302478 of application Ser. No. 12/982,777, filed Dec. 30, 2010, naming Harm Cronie and Amin Shokrollahi, entitled "Power and Pin Efficient Chip-to-Chip Communications with Common-Mode Resilience and SSO Resilience" (hereinafter "Cronie II").

U.S. patent application Ser. No. 13/030,027, filed Feb. 17, 2011, naming Harm Cronie, Amin Shokrollahi and Armin Tajalli, entitled "Methods and Systems for Noise Resilient, Pin-Efficient and Low Power Communications with Sparse Signaling Codes" (hereinafter "Cronie III").

U.S. patent application Ser. No. 13/176,657, filed Jul. 5, 2011, naming Harm Cronie and Amin Shokrollahi, entitled "Methods and Systems for Low-power and Pin-efficient Communications with Superposition Signaling Codes" (hereinafter "Cronie IV").

U.S. Patent Application No. 61/697,540, filed Sep. 6, 2012, naming Harm Cronie and Brian Holden, entitled "Sorting Decoder" (hereafter called "Cronie V".)

U.S. patent application Ser. No. 13/542,599, filed Jul. 5, 2012, naming Armin Tajalli, Harm Cronie, and Amin Shokrollhi entitled "Methods and Circuits for Efficient Processing and Detection of Balanced Codes" (hereafter called "Tajalli I".)

The following additional reference to prior art has been cited in this application:

[Buchwald1] U.S. Pat. No. 6,509,773, filed Apr. 30, 2001 by Buchwald et al., entitled "Phase interpolator device and method."

FIELD OF THE INVENTION

The present invention relates to communications systems circuits generally, and more particularly to the configuration, control, and management of high-speed multi-wire serial interfaces used for chip-to-chip communication, including compensation of differential propagation delay.

BACKGROUND

In modern digital systems, digital information has to be processed in a reliable and efficient way. In this context, digital information is to be understood as information available in discrete, i.e., discontinuous values. Bits, collection of bits, but also numbers from a finite set can be used to represent digital information.

In most chip-to-chip, or device-to-device communication systems, communication takes place over a plurality of wires to increase the aggregate bandwidth. A single or pair of these wires may be referred to as a channel or link and multiple channels create a communication bus between the electronic components. At the physical circuitry level, in chip-to-chip communication systems, buses are typically made of electrical conductors in the package between chips and motherboards, on printed circuit boards ("PCBs") boards or in cables and connectors between PCBs. In high frequency applications, microstrip or stripline PCB traces may be used.

Common methods for transmitting signals over bus wires include single-ended and differential signaling methods. In applications requiring high speed communications, those methods can be further optimized in terms of power consumption and pin-efficiency, especially in high-speed communications. More recently, vector signaling methods have been proposed to further optimize the trade-offs between power consumption, pin efficiency and noise robustness of chip-to-chip communication systems. In those vector signaling systems, the digital information is transformed into a different representation space in the form of a vector codeword that is chosen in order to optimize the power consumption, pin-efficiency and speed trade-offs based on the transmission channel properties and communication system design constraints. Herein, this process is referred to as "encoding". At the receiver side, the received signals corresponding to the codeword are transformed back into the original digital information representation space. Herein, this process is referred to as "decoding".

FIG. 1 represents a high-level block diagram of such a prior art communication system. At the transmit unit 100 side of the communication system, an encoder 110 transforms a sequence of k information symbols 105 into a vector codeword CW. A driver 120 maps vector codeword CW into a set of physical signals and transmits them on the n wires 135 of bus 130. Although FIG. 1 shows a number of lines for the k information symbols 105 and a number of wires 135, it should be understood that different values for k and n could be used and they need not be equal.

At the other side of bus 130, a receive unit 140 maps the n received physical signals from wires 135 back into k information symbols 145. Receive unit 140 comprises a bus receiver in the form of a signal-to-digital converter ("SDC") 160 and a vector codeword decoder ("DEC") 170. In FIG. 1, a task of the SDC 160 is to reconstruct an estimate of the transmitted vector codeword CW from the analog signals transmitted and recorded over the n bus wires 135. SDC 160 then transmits the estimate of vector codeword CW to codeword decoder 170. Codeword decoder 170 can then reconstruct the k output bits by applying the reverse transformation from that of transmit encoder 110. SDC 160 is shown comprising a sampler 180 and a rank-order unit 190.

As an example, bus 130 might be a bus between a processor and memory. In that case, the physical wires may take the form of striplines or microstrips on a PCB. Another example of bus 130 might be a set of wires connecting two different devices.

BRIEF SUMMARY OF THE INVENTION

High speed communications interfaces comprising multiple independent channels operating as a group introduce new operational issues not seen in single-circuit links. Beyond the usual requirements of clock recovery, data framing, and channel equalization, inter-channel effects such as differential link gain and differential link delay must also be addressed to insure that the signals received on all channels may be combined to accurately reproduce at the receiver the group-encoded symbols sent by the transmitter.

Methods are described to adjust channel receive characteristics to optimize data transfer, both as a link initialization procedure using known training sequences, and as a dynamic adjustment process performed during normal data transmission.

DETAILED DESCRIPTION OF THE INVENTION

As described in Cronie I, Cronie II, Cronie III and Cronie IV, vector signaling codes may be used to produce extremely high bandwidth data communications links, such as between two integrated circuit devices in a system. Multiple data communications channels transmit symbols of the vector signaling code, acting together to communicate codewords of the vector signaling code. Thus, proper operation of the communications interface requires two levels of operational management and control: adjustment of each individual channel so as to accurately communicate individual symbols, and coordination across all channels so as to deliver coherent codewords of the vector signaling code for decoding.

Depending on the particular vector signaling code used, the number of channels comprising a communications link may range from two to eight or more. Individual symbols, e.g. transmissions on any single communications channel, may utilize multiple signal levels, often three or more. Operation at channel rates exceeding 10 Gbps may further complicate receive behavior by requiring deeply pipelined or parallelized signal processing, precluding reception methods that require the previous received value to be known as the current value is being received.

Embodiments described herein can also be applied to prior art permutation sorting methods not covered by the vector processing methods of Cronie II, Cronie III, Cronie IV and/or Cronie V. More generally, embodiments of the present invention can apply to any communication or storage methods requiring coordination of multiple channels or elements of the channel to produce a coherent aggregate result.

Vector Processing Background

In this disclosure, the methods disclosed in Cronie II, Cronie III, and Cronie IV are collectively described as "vector processing" methods, including permutation modulation codes as in Cronie III and sparse signaling codes as in Cronie IV. A permutation modulation code or sparse signaling code $CW_1$ is defined by a basis vector, $x_0$, where the code consists of all permutations of $x_0$.

One permutation modulation code used in examples herein is the "8b8w" code, so named as it can encode eight binary bits of data for communication over eight wires. The 8b8w code is balanced and ternary, and consists of the symbol values "+1", "0", and "−1" in any permutation of the basis vector "+1, +1, 0, 0, 0, 0, −1, −1", as described in Cronie III. Another permutation modulation code is the "H4" code, derived from the 4×4 Hadamard matrix as described in Cronie I. The H4 code consists of all permutations of the symbol values "+1, −⅓, −⅓, −⅓" and "−1, +⅓, +⅓, +⅓". Thus, it is balanced and quaternary, although any one H4 codeword utilizes only two of the four possible symbol values.

Figure 1:
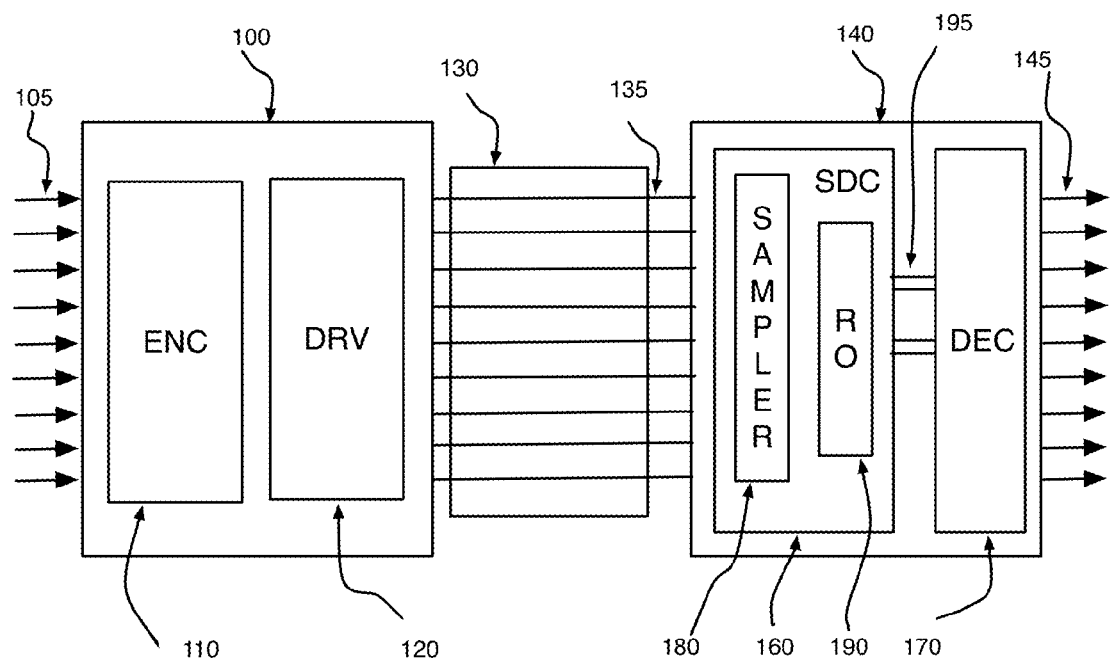
FIG. 1 is a block diagram of a prior art communications system.

A common theme in vector processing methods is that permutation modulation methods are most efficiently decoded by integrating a sorting decoder at the communication receiver, as illustrated as 160 in FIG. 1, where a rank-order unit 190 sorts the input signals according to their ranking, that is, an indication of the relative ranks of each input signal compared to the others. This ranking uniquely determines the interpretation of input signals as symbols of the permutation modulation code, and thus the decoding of the underlying codeword associated with the analog signals transmitted over bus 130. Another embodiment utilizes digital comparators that directly compare the signal differences between each pair of input signal wires. These differences may be directly utilized as a ranked or ordered result, or may subsequently be refined by a further ranking operation. Just as signals are "detected" when their received state is discerned, a vector signaling code is "detected" when a receiver obtains sufficient information to uniquely identify its codewords.

The rank-order sorting operation may determine a full ordering of the sampled values on the wires or a partial order. A full ordering would mean that all values on the n wires are sorted. A partial ordering would mean that only a subset of the wires are determined that carry some of the largest and some of the smallest values, which is enough when the other values are non-quiescent, in particular in the case of a sparse modulation code. For purposes of explanation, the following descriptions assume the sampled values are ordered from a most positive or "highest" value, to a most negative or "lowest" value, where values representing "+1" symbols are higher than those representing "0" which are in turn higher than those representing "−1". In practice, these values may span positive and negative signal voltages including zero, or may be exclusively positive or exclusively negative signal voltage values.

Possible detailed embodiments of rank-order units 190 and codeword decoder 170 have been taught in Cronie III. For instance, in some embodiments, rank-order units 190 may further comprise a max-detector unit to select the highest (positive) values and a min-detector unit to select the lowest (negative) values out of the n components of the sampled y vector signal.

An example of a sampled 8b8w vector signal may be:

$$y=[1.1\ 0.2\ -1.3\ 0.19\ -0.9\ 0.01\ -0.3\ 1.2] \qquad \text{Eqn. 3}$$

where the largest value 1.2 is detected on wire 8, the second largest value 1.1 is detected on wire 1, the smallest value −1.3 is detected on wire 3 and the second smallest value is detected on wire 5. The remaining elements are treated as corresponding to "0" elements. Thus, the rank order unit may output a vector [2, 3, 8, 4, 7, 5, 6, 1], or in some embodiments, [2, x, 8, x, 7, x, x, 1]. The outputs may be binary values, thermometer codes, or another suitable format.

Codeword decoder 170 can then reconstruct the original vector $CW_1$ as:

$$CW_1=[+1\ 0\ -1\ 0\ -1\ 0\ 0\ +1] \qquad \text{Eqn. 4}$$

Codeword decoder 170 can then further reconstruct the k output bits 145 by mapping back vector $CW_1$ into the initial representation space, by applying the reverse operation of encoder 110.

Example Receiver Architecture

Figure 2:
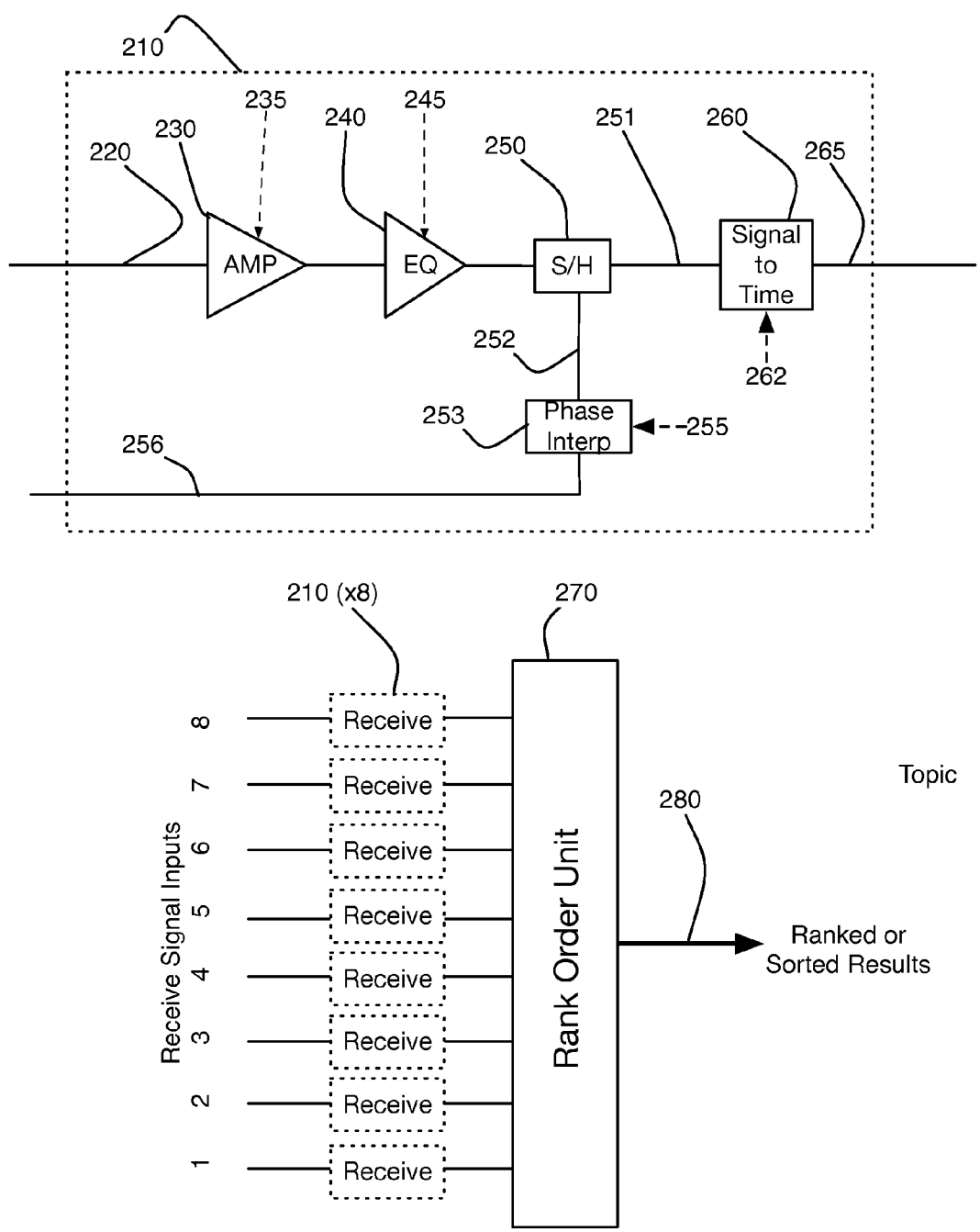
FIG. 2 is a block diagram of a vector signal code receiver for an example 8 channel link in accordance with at least one embodiment of the invention.

For purposes of description, one example embodiment of the receiver component of a vector signaling code communications architecture in accordance with the invention is illustrated in FIG. 2, utilizing codewords of the 8b8w code, consisting of eight symbols carried by printed circuit board traces or striplines from a transmitting integrated circuit chip to a receiving integrated circuit chip. Following well-known best practices, the individual signal lines comprising the communications link are routed with minimal bends, vias, or other transmission line impedance anomalies and have identical signal path lengths, with the intent of producing identical signal characteristics and transmission delays. However, it is known that manufacturing variations including printed circuit board chemical composition, layer spacing, and trace width variation can affect both trace or stripline impedance and delay characteristics. Moreover, external factors such as adjacent metallic or dielectric objects, as well as ambient temperature and humidity are also known to influence signal line characteristics.

Thus, multiwire bus design rules adequate to support Megahertz signaling rates and simple differential links may be found to be insufficient at Gigahertz speeds and wider communications channels, requiring the introduction of active equalization to provide adequate signal edge definition, and skew control to compensate for differential delay characteristics among the channels.

A separate receive channel circuit 210 is provided for each receive signal line comprising the vector signaling code communications link as shown in FIG. 2a. A channel's receive signal line 220 is terminated at receive amplifier 230 which can compensate for overall signal strength loss over the transmission path. A separate line equalizer 240 is shown, although some embodiments may integrate the functions 230 and 240. The equalizer provides compensation for frequency-dependent channel loss characteristics; some embodiments perform an equivalent operation in the time domain, as with a Decision Feedback Equalization circuit. Receive signal voltage characteristics such as gain and/or offset voltage may be adjusted using receive amplifier adjustments 235, and line equalization characteristics may be adjusted using equalization adjustments 245. A sample-and-hold circuit 250 is used to produce a stable signal level on the sampled signal 251 during the signal amplitude measurement operation, here shown as a signal-to-time converter 260 calibrated using converter controls 262 to produce digital output 265. The timing of the sample operation is controlled by channel sampling clock 252, which is derived by channel Phase Interpolator 253 from the symbol-rate receive clock 256 under control of channel phase adjustment 255.

For the purposes of this document, the use of a track-and-hold circuit with an output that is not used in further processing until its hold step shall be considered equivalent to the described sample-and-hold circuit.

As illustrated in FIG. 2, the output of each receive channel circuit 210 is input to a ranking or sorting circuit 270, which produces a ranked or sorted result 280 identifying the inputs in order of signal amplitude. The ranked or sorted results are subsequently processed, first by being categorized as symbol elements of the vector signaling codeword, then by decoding the codeword to recreate the originally transmitted data.

Figure 7:
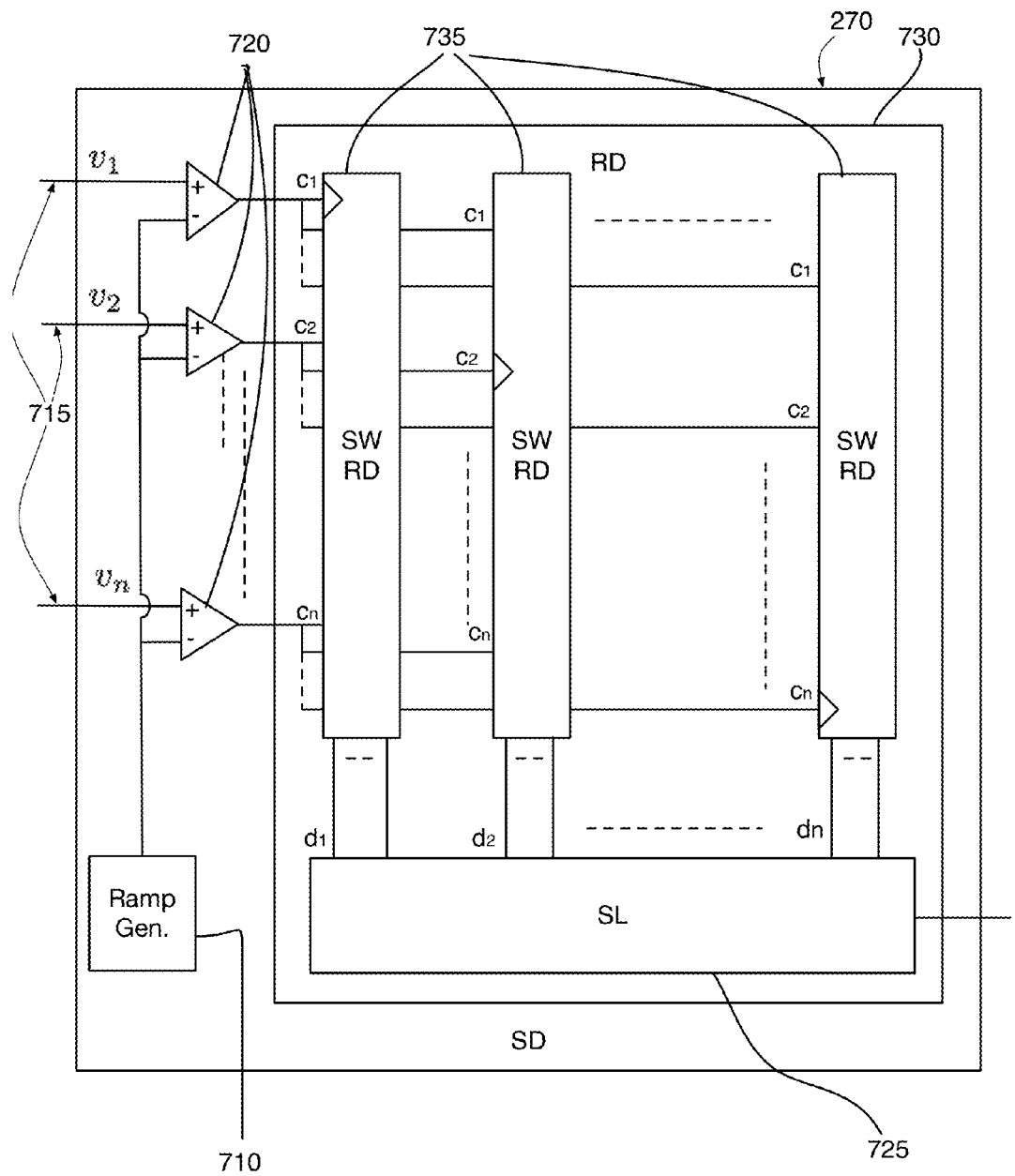
FIG. 7 is a block diagram of one embodiment of a Sorting Decoder.
Figure 8:
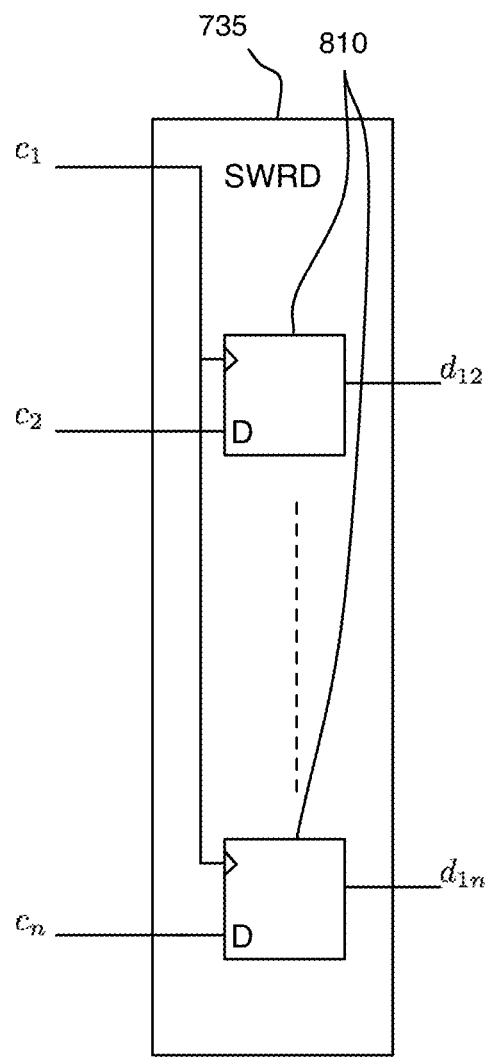
FIG. 8 is a block diagram of one embodiment of a Single Wire Rank Detector as used in the Sorting Decoder of FIG. 7.

The operation of ranking or sorting circuit 270 is further detailed in FIG. 7, showing one such embodiment provided herein for purposes of illustration and without limitation. Each input signal 715 is presented to a digital comparator 720, where they are compared to a ramping analog reference signal produced by Ramp Generator 710, which for purposes of description and without limitation may be considered as rising from a low or negative level to a high or positive level. As the ramp signal level reaches that of an input signal, the output state of the comparator associated with that input signal will change. The collection of Single Wire Rank Detectors 735 collectively identifies the relative order in which these comparator output states change. As seen in FIG. 8, showing one such SWRD embodiment provided herein for purposes of illustration and without limitation, a SWRD contains a set of edge-triggered flip-flops, triggered by the change of state of one input, and capturing at that moment of triggering the state of all other inputs. With one SWRD triggered by each comparator 720 output, the collection of SWRD allows identification of the first, second, . . . , last output to change, which is equivalent to identifying the most negative, second most negative, . . . , most positive input value if the ramp produced by Ramp Generator 710 rises in a negative-to-positive manner. As taught by Cronie V, other orderings may be obtained with different ramp signal level variations over time, and other circuit embodiments may be used to perform the operations described in these examples.

Figure 3:
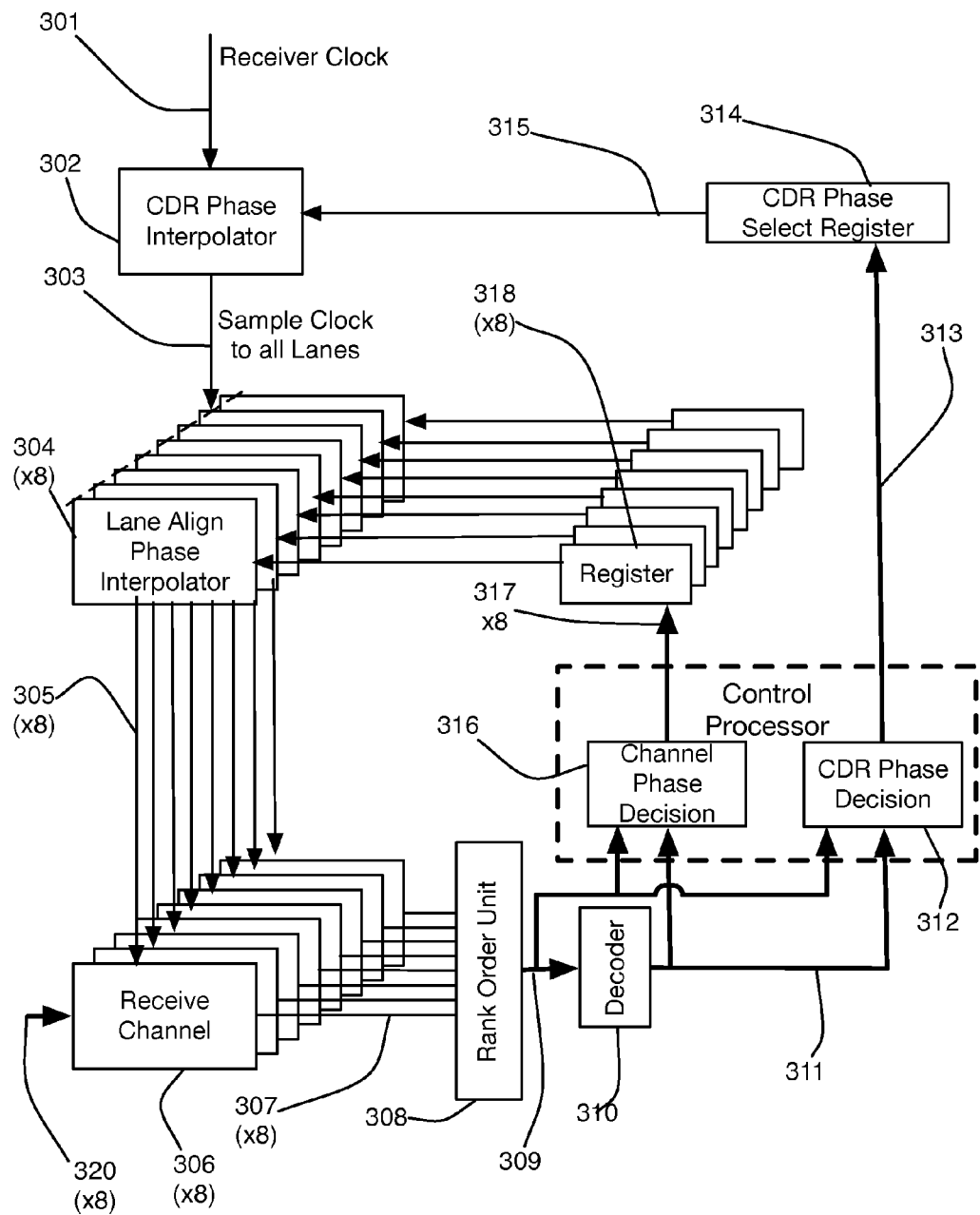
FIG. 3 is a block diagram of a receive clock control system having a master receive clock and individual phase interpolators for each channel in accordance with at least one embodiment of the invention.

The relationship between the symbol-rate master receive clock and the signal sampling interval on each channel is show in greater detail in FIG. 3. The master receive clock 301 may be generated from the received signal using conventional means, such as a phase-locked or delay-locked loop. For purposes of explanation, this master receive clock may be presumed to be stable and isochronous to the original transmit symbol clock rate, albeit with some phase offset. An appropriately compensating phase offset (here called CDR) is produced by CDR Phase interpolator 302 under control of CDR phase select register 314, producing a symbol-rate sample clock 303 representing a baseline offset for all sampling elements together. This clock is distributed to each of the Lane Align Phase Interpolators 304 which introduce a further per-channel offset under control of each phase select registers 318, to produce individual skew-adjusted sampling clocks 305 for each receive channel 306.

As previously described, each receive channel 306 produces a digital output signal 307 proportionate to receive channel input 320 signal level. These digital output signals 307 are compared 308 (as an example, as pulse-position-encoded signals compared by an arbiter circuit) producing ranked outputs 309 which may be decoded 310 for computational convenience into a permuted enumeration 311 for analysis by CDR phase decision system 312 and channel phase decision system 316, respectively producing CDR phase adjustments 313 and channel phase adjustments 317.

There are thus two phase control loops—a first loop controlling overall phase of sample clock 303, and a second loop which controls offset from sample clock 303 to each individual channel sampling clocks 305.

Example embodiments of the component circuits of such a receiver are taught in Tajalli I and Cronie V.

Impact of Selecting Sample Time

Figure 4:
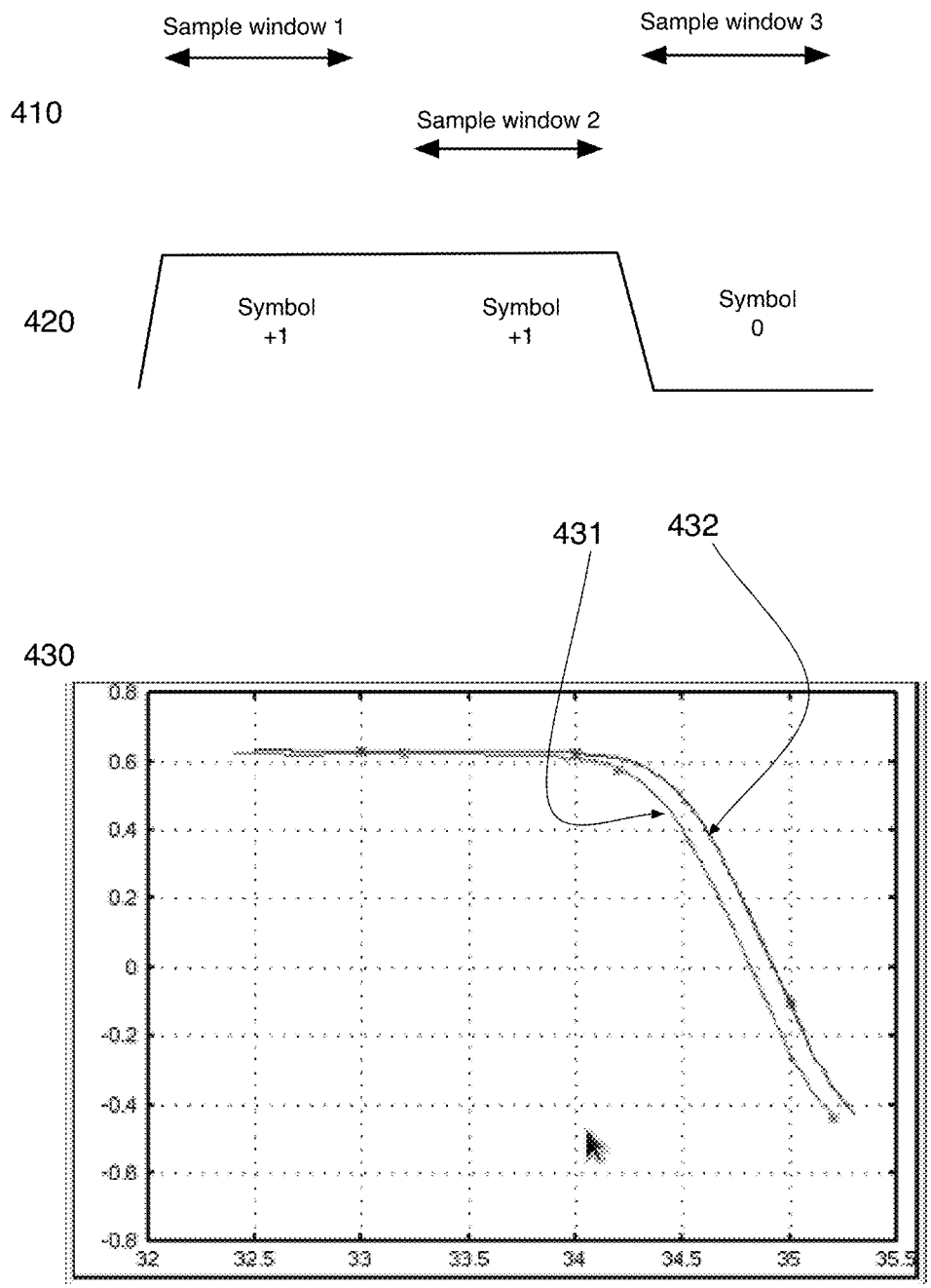
FIG. 4 illustrates the use of signal amplitude measurement to measure and adjust signal sample timing in accordance with at least one embodiment of the invention.

FIG. 4 illustrates the relationship in at least one embodiment in accordance with the invention between the time interval in which a receive channel's sample-and-hold circuit samples an input signal, and the resulting signal voltage as determined by the voltage-to-time converter. If input signals were unchanging, sample timing would have no impact. However, if a signal transitioning from, as an example, a +1 volt level to a zero volt level is sampled during the transition, an intermediate measurement between 1 and 0 will result. This effect is well known for single-circuit serial links, and is typically addressed in such circuits as part of maximizing receive "eye opening" using conventional clock recovery methods.

When codewords composed of multiple symbols are transmitted on multiple channels, this effect may cause variations in signal arrival times between different channels to appear as variations in receive signal amplitudes on those channels, if all channels are sampled simultaneously. These variations subsequently result in different sort orders obtained from the sorting decoder, potentially resulting in incorrect symbol identification. Thus, the single-link concept of "eye opening" is seen to have two distinct components in systems utilizing vector signaling codes; a per-wire component focused on producing normalized signal levels by sampling that wire in the center of its stable time, and an aggregate component dedicated to delivering correctly-formed codewords composed of symbols coherent in time, that is, originally transmitted together and equitably combined by the receiver. Operationally, this implies two levels of parameter manipulation are also required, to control adjustment of individual channel gain, equalization, and sample timing, and to manage cross-channel variations including differential gain and timing skew.

Measuring Channel Gain Characteristics

At least one embodiment in accordance with the invention does not include separate channel measurement sensors to, as examples, measure absolute signal levels on individual circuits or signal edge transitions independent of the selected sampling window. Addition of such additional measurement components would significantly impact complexity, performance, and cost of the communications system. Therefore, it is advantageous to identify solutions allowing analyses of both initial and ongoing signal characteristics using metrics already present in the existing receiver and decoder systems.

As an example, consider the operation of the sorting decoder. Its output is a ranking of inputs by amplitude which are subsequently categorized into, using the example of the 8b8w code of Cronie III, two positive values corresponding to symbols herein called "+1", four quiescent values corresponding to symbols herein called "0", and two negative values corresponding to symbols herein called "−1".

No absolute numeric values are available for the measured signal levels. However, analysis of the symbol categorization results over time can provide indications of differential behavior among channels. For example, if the absolute signal amplitudes of channels 1 and 2 were identical, then it follows that "+1" symbols identified as appearing simultaneously on the two channels should, on average, appear in first-to-last sorted channel results in {1, 2, . . . } and {2, 1, . . . } orders with equal probability. Conversely, a bias of channel 1 always being ranked ahead of (in this example, more positive than) channel 2 in such measurements may indicate a differential gain imbalance between those channels. Similar arguments may be made for "−1" symbols, and for "0" symbols, addressing other adjustable characteristics such as voltage-to-time converter scale and offset voltage, rather than channel gain.

In at least one embodiment in accordance with the invention, the information available for analysis consists of the raw ranking results 280 provided by the ranking decoder 270 of FIG. 2, and the knowledge of how those ranks will be interpreted by subsequent logic, based on the specifics of the vector signaling code being used.

To distinguish steady-state and transient signal effects, triplets of ranking information obtained in three consecutive clock intervals are analyzed rather than individual interval data. Thus, as an example, consecutive identification of ranked results that would be interpreted as [+1, +1, +1] symbols simultaneously occurring on both channel 1 and channel 2 provides an excellent opportunity to compare steady-state differential gain on those two channels, as the middle of the three samples will be relatively unaffected by transient effects such as equalization or skew.

At least one embodiment in accordance with the invention stores results obtained from the rank decoder on consecutive symbol intervals for analysis by a control processor. For the example 8b8w code and highest to lowest ranks numbered 1 to 8, ranks 1 and 2 correspond to "+1" symbols, ranks 3 through 6 correspond to "0" symbols, and ranks 7 and 8 correspond to "−1" symbols. In a well-balanced system (uniform gain and equalization across all channels, well calibrated measurement circuits, etc.) a given wire should have equal probability of being ranked 1 or 2 in the middle sample of three consecutive "+1" symbols. Similarly, a middle sample of three consecutive "−1" symbols should have equal probability of being ranked 7 or 8, and a middle sample of three consecutive "0" symbol should have equal probability of being ranked 4 or 5, and equal probability of being ranked 3 or 6. Symbol triplets suitable for steady-state voltage adjustments such as gain and DC offset are listed in Table 1.

TABLE 1

| triplets usable for gain and DC offset control |
| --- |
| [−1 −1 −1] [0 0 0] [1 1 1] |

In at least one embodiment, results are stored using a memory device. The memory device may include (or take the form of) random access memory (RAM), flash memory, volatile memory devices, non-volatile memory devices, transistors, flip flops, latches, capacitors, or any other memory device as known to one of skill in the art.

At least one embodiment in accordance with the invention encapsulates such desirable sequences as pattern-matching "rules", which are evaluated by an out-of-band control processor. Rules utilizing analysis of a signal characteristic over time (such as "equal probability of rank 1 and 2") may be called "statistical" rules, and require assessment of many comparison events and thus storage of ongoing statistical measurements. More conveniently, rules may directly compare the values seen when desirable patterns simultaneously occur on two different wires; so-called "direct comparison"

rules. For direct comparison rules, all of the information necessary for analysis is contained in the rule pattern, identification of the two wires associated with the pattern, and an identifier of which wire has the more positive sorted or ranked value in the middle value of the triplet, which may be provided by a single bit of information.

It should be noted that such pattern-matching rules do not necessarily require the intentional transmission of known data patterns or sequences, as in a link start-up or "training" code pattern. At least one embodiment in accordance with the invention utilizes such training patterns to calibrate and adjust link characteristics. Known training patterns facilitate adjustment of systems where there is no a priori knowledge of channel loss, skew, or noise characteristics, as an example at system startup time. This allows gross calibration adjustments of, as an example, receive clock phase to be made without risk of data corruption. However, the described measurement and adjustment methods may be applied equally well to incremental adjustments using data patterns found to occur during normal data transmission. At least one embodiment in accordance with the invention performs incremental adjustments of link characteristics non-disruptively during normal data transmission, for purposes of continually optimizing link operation and dynamically adapting to changing signal characteristics.

Various embodiments in accordance with the invention present data to the control processor for analysis using a serial or parallel interface, FIFO data structure, shared memory, and/or message-passing interface. The data for analysis may consist of raw output results from the sorting decoder, such results converted into wire ranking form, or such results filtered or pre-processed to present only the information necessary for analysis. Data may be provided continuously, or as bursts of consecutive measurements sent periodically, and the control processor may be implemented as a dedicated logic circuit, programmed logic finite state machine, or software running on a general-purpose processor.

At least one embodiment in accordance with the invention encodes the sorting decoder ranks using the permuted enumeration shown in Table 2. Using this permutation, the most-significant bit or bits of the number identifies the symbol value represented to allow quick comparison when identifying triplets, and the least-significant bit or bits of the number shows relative rank within the same symbol value to permit two wires of the same symbol value to be quickly compared in relative rank.

TABLE 2 encoded sorting decoder output values

| Number | Rank | Symbol value |
| --- | --- | --- |
| 111 | highest ranked signal | +1 |
| 110 | | +1 |
| 011 | | 0 |
| 010 | | 0 |
| 001 | | 0 |
| 000 | | 0 |
| 101 | | −1 |
| 100 | lowest ranked signal | −1 |

An embodiment using such a permuted enumeration to identify the ranking of eight wires will transmit to the control processor 8×3 bits of information per symbol interval, for sufficient consecutive symbol intervals to provide reasonable expectation that suitable simultaneously-occurring triplets may be identified within the set.

Measuring Dynamic Channel Characteristics

Additional triplet patterns may be considered which correspond to rules for analysis of dynamic channel characteristics, including line equalization, sampling clock phase, and incremental clock offset (also known as "skew compensation.")

Consider a pattern of consecutive symbols such as ["0", "+1", "0"]. In an ideal well-equalized system, the peak amplitude of the single-interval "+1" pulse would be the same as a steady-state "+1" signal on the same wire, and rise- and fall-times would be fast and without overshoot so that "0" values preceding and following the pulse would also be comparable to those seen during steady-state "0" on the same wire. Variations from this ideal may indicate under-equalization, resulting in slow rise/fall times which will be seen as lower pulse amplitude and/or higher pre- and post-pulse amplitude, or over-equalization which presents itself as overshoot or ringing which will be seen as anomalous high pulse amplitudes and/or low pre- or -post pulse levels. Triplets suitable for equalization adjustment are listed in Table 3.

TABLE 3 triplets usable for analog equalization control

Reference Flat lines: [−1 −1 −1] [0 0 0] [+1 +1 +1]
Pulses: [0 +1 0] [+1 0 +1] [0 −1 0] [−1 0 −1]

In at least one embodiment of the invention, an out-of-band control processor responds to identification of incorrect equalization, as evidenced as one example as observation that a different rank ordering always occurs on the middle sample of a "pulse" triplet versus on the middle sample of a "reference flat line" triplet, for a first wire as compared to a second wire.

Sampling Clock Phase Measurement

Similarly, asymmetries in the pre- and post-pulse values may indicate a timing window error in that channel's sample-and-hold circuit. Using the same example pattern, early sampling may cause the pre-pulse value to appear to be slightly high, and the pulse value to appear to be slightly low, as the measurement window will incorrectly include portions of the adjacent time period.

At least one embodiment in accordance with the invention identifies timing window errors more directly, using symbol triplets that cover time periods in which there is a single monotonic rising or single monotonic falling signal transition on each of a pair of wires, as enumerated in Table 4 for the example of an 8b8w vector signaling code.

TABLE 4 triplets usable for clock phase alignment

[+1 +1 0] [+1 +1 −1] [+1 0 0] [+1 −1 −1] [0 +1 +1]
[0 −1 −1] [0 0 +1] [0 0 −1] [−1 −1 0] [−1 −1 +1]
[−1 0 0] [−1 +1 +1] [+1 0 −1] o [−1 0 +1]

In at least one embodiment in accordance with the invention, a master symbol-interval sample clock is generated which corresponds to the periodic reception of valid symbols across all wires. Adjustable delay elements (herein called Phase Interpolators) are used to allow each individual wire's receive channel sampling time to be offset incrementally from that master clock, allowing each wire's signal to be sampled at the appropriate time for its particular propagation delay characteristics. FIG. 3 illustrates the relationship of clock, signal, and control measurement components of such a receiver at channel and symbol levels.

For the master clock phase adjustment, identified as CDR Phase Interpolator 302 in FIG. 3, one of the triplets in Table 4 is used on one wire, and its time-reversed compliment on another wire. Thus, a pattern of [+1 +1 0] on wire 1 and a simultaneous pattern of [0 +1 +1] on wire 2 would be suitable for master clock adjustment. For this pattern, the lower amplitude of the center sample in the triplet indicates whether the master clock is too early or too late. If [+1 +1 0] has the lower amplitude center sample, we are sampling too late (too close to the trailing 0) and the phase of the master clock should be incrementally moved earlier by reducing the CDR phase adjustment amount. Conversely, if [0 +1 +1] has the lower amplitude center sample, we are sampling too early (too close to the leading 0) and the phase of the master clock should be incrementally moved later by increasing the CDR phase adjustment amount. Similar reasoning may be applied to the other CDR Phase Interpolator adjustment triplets.

The same triplets in Table 4 are also used to adjust the incremental delay of the individual Phase Interpolators associated with each wire, identified as Lane Align Phase Interpolators 304 in FIG. 3. In this case, identical triplet patterns are identified on both wires. Using the example of a [+1 +1 0] pattern simultaneously occurring on wires 1 and 2, the wire experiencing the later relative sample will see its triplet's center sample having a lower value (closer to the trailing 0), thus should have its Lane Align Phase Interpolator delay nudged slightly earlier. Similar reasoning may be applied to the other Lane Align Phase Interpolator adjustment triplets.

The described application of the signal amplitude measurements performed during this triplet analysis to discern errors in sampling time is graphically illustrated in FIG. 4, which illustrates reception of a [+1, +1, 0] symbol triplet on two wires. As shown in 420, a transmitted signal representing a +1 symbol is received (approximately between times 32.5 and 33.5 on the X axis of graph 430) followed by a second +1 symbol (approximately 33.5 to 34.5) and a 0 symbol (34.5 to 35.5.) The sampling windows used to capture the signal levels representing the symbols are shown in 410. If the propagation delay of the first of the two wires is slightly less than that of the second wire (that is, the sample window is slightly late on that wire relative to its actual signal transitions) the values measured during the sample intervals will be as shown in graph 430, where measured first wire value 431 is slightly lower (i.e. incorporates some portion of the trailing 0 symbol value) relative to measured second wire value 432.

Figure 5:
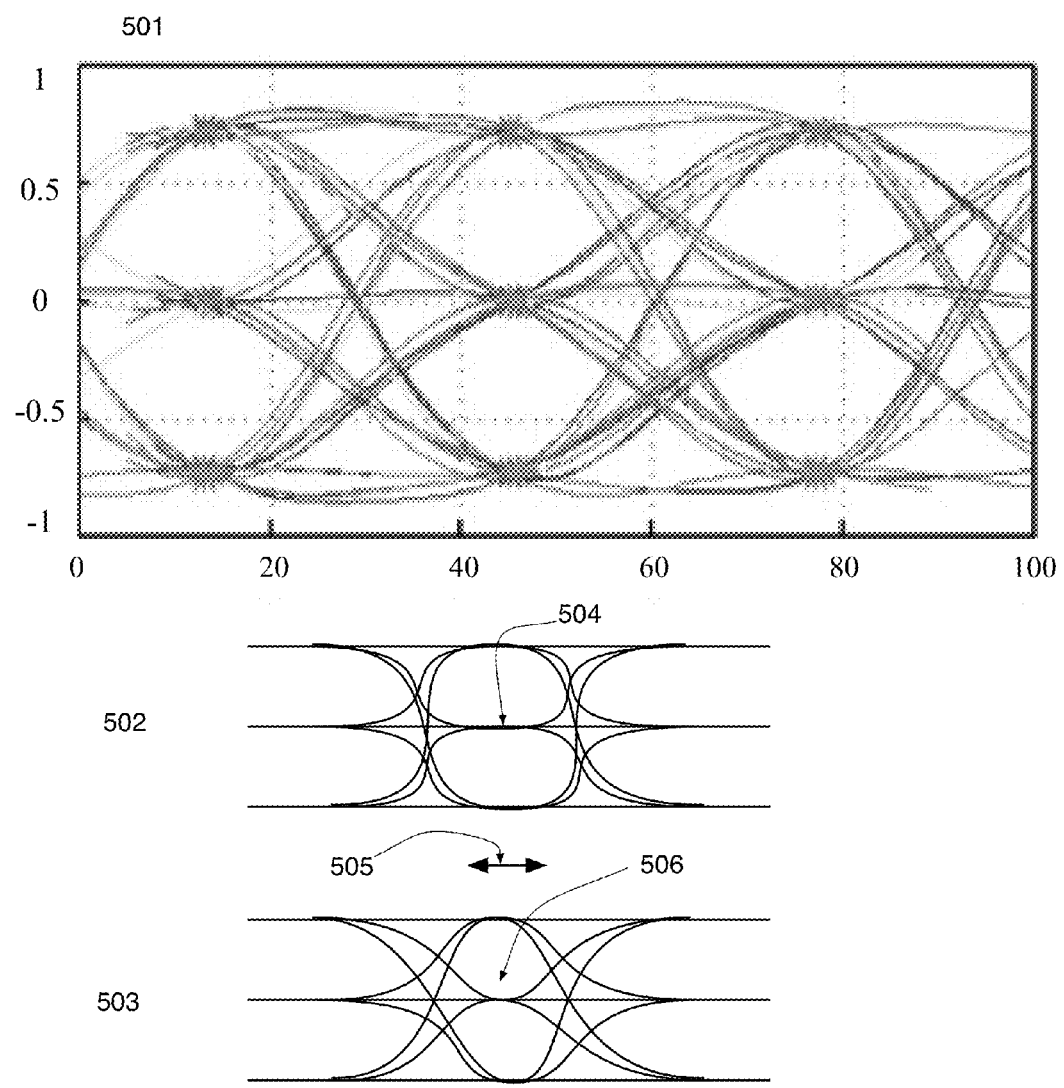
FIG. 5 shows the effect of receive channel conditions using a receive channel eye chart, in accordance with at least one embodiment of the invention.

It is noted that the sensitivity of both master clock and incremental delay measurements are heightened under slightly degraded signal conditions. FIG. 5 shows a typical eye diagram for a single receive channel 501. Under optimum signal characteristics, the "eye" will be fully open as illustrated at 502 with the fast signal rise and fall times producing a fairly flat bottom 504. Under these conditions, sampling window timing 505 can move slightly earlier or later than its optimum point without significant change in detected signal level. When signal condition are degraded or rise and fall times are slower as illustrated in 503, a slight timing offset of the sampling window 505 quickly intersects the rising or falling edge of a signal transition 506, introducing a change in the measured value and thus signaling an error.

This reduction in loop sensitivity under optimum signal characteristics is similar to the "dead zone" around the set value that is often seen in traditional closed-loop feedback systems. At least one embodiment in accordance with the invention intentionally reduces high-frequency compensation under good signal conditions to increase the slope of the eye bottom 504, thus reducing the time adjustment dead zone without impacting overall error rate.

Measurement and Control Loop

Figure 6:
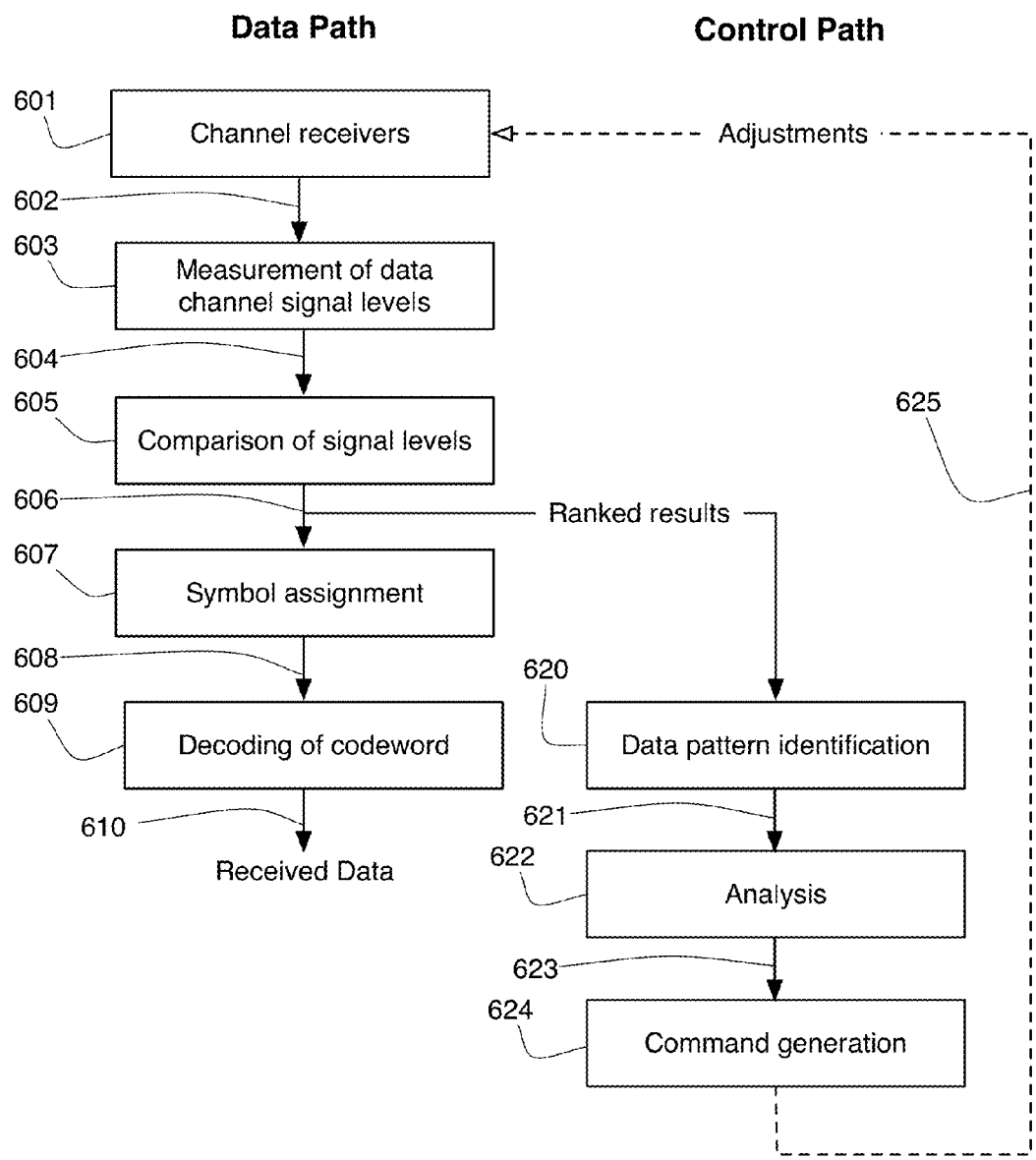
FIG. 6 is a block diagram illustrating the measurement and control process in accordance with at least one embodiment of the invention.

The relationship between the existing elements of a vector signaling code receive data path and the measurement and control loop in accordance with at least one embodiment of the invention is shown in FIG. 6. The existing data path or so-called in-band processing incorporates channel receivers 601 as detailed as 210 in FIG. 2, which accept, amplify, and equalize channel input signals to produce outputs 602. These are measured 603 and compared 604 to produce ranked results 606. The data path operations continue by assigning 607 vector signaling code symbol values to the various channels to produce a codeword 608, which may then be decoded 609 to produce the received data output 610.

As previously described, the control loop that manages this receive operation re-uses many of the existing data path functions, rather than requiring separate measurement devices. Different embodiments in accordance with the invention may implement this management of receive operation using an out-of-band control processor herein simply called the control processor, implemented as dedicated logic circuits, a programmed logic finite state machine, or as software running on a general-purpose processor. The control processor examines ranked results 606 to identify 620 data patterns 621, such as the consecutive triplets of results of Tables 1, 3, and 4. These data patterns are analyzed 622 to determine if a channel secondary characteristic such as gain, offset, equalization, or sample timing requires adjustment 623. If so, the control processor issues commands 624 to initiate the adjustments 625 to the data path receiver resulting in changes to one or more of its operational functions or parameters.

Various embodiments in accordance with the invention interface these command/control operations issued by the control processor to in-band data processing circuitry to perform the desired adjustment, using a serial or parallel interface, FIFO data structure, shared memory, and/or message-passing interface. Alternate and equivalent embodiments of the invention may co-located elements of these control, interface, and adjustment circuits within with the data channels (i.e. in-band), at the control processor, or distributed between the data channels and control processor. Elements of such adjustment circuits, as one example a Digital-to-Analog converter (DAC), may be dedicated to a single wire or adjustment function or may be shared by two or more wires or functions. In the latter case, multiplexing elements such as sample-and-hold circuits may also be incorporated to facilitate such DAC sharing.

Embodiments

In at least one embodiment of the invention, the control processor response to identification of a gain variation is to adjust the gain of at least one wire's input amplifier. As is well known in the art, such gain adjustment may be implemented by modifying the current available to an amplification stage, changing the resistance of a voltage- or current-controlled variable resistance element, switching resistance elements into the circuit in series or in parallel combinations, or utilizing a resistive ladder structure controlled by switching transistors to produce a binary or other hierarchy of resistive values applied to the circuit at a predetermined gain adjustment node.

In at least one embodiment of the invention, the control processor response to identification of a frequency compensation or equalization variation is to electronically adjust one ore more resistive, inductive, or capacitive elements of one or more wire continuous time linear equalizer (CTLE) circuits, as one example. Such adjustment methods are well known in the art, and may utilize electronic switching of passive resistive, inductive, or capacitive elements, or adjustment of inherently variable active devices such as varactors, MOS channel resistors, etc.

In at least one embodiment of the invention the control processor response to identification of a voltage offset variation is to modify the bias or baseline voltage output level of at least one wire's input amplifier. As is also well known in the art, this modification may be produced by modifying the current entering a node of the amplifier, providing an offsetting voltage to a node of the amplifier, modifying the input bias provided to the amplifier, or adjusting the resistive value of an element within the amplifier using one of the previously described methods.

In at least one embodiment of the invention, the control processor response to a timing-related variation is to adjust one or more Phase Interpolators controlling timing in one or more data path receivers. As is well known in the art, phase interpolators mix two or more phases of a multiphase clock so as to synthesize an output clock with the desired phase relationship. Embodiments are known in which such mixing is performed in the analog and in the digital domain. Alternative embodiments may utilize variable delay structures known in the art, such as tapped delay lines or variable delay lines controlled by the control processor to provide equivalent timing adjustment.

In at least one embodiment, a system comprises a plurality of receive channel circuits, each receive channel circuit configured to receive an input signal of a set of input signals, each input signal representing a symbol of a codeword of a vector signaling code; a plurality of sample units configured to generate a set of signal sample values based on the set of input signals; a rank-order unit configured to provide a set of rank order values comprising a respective rank order value for each signal sample value, each rank order value indicative of a relative magnitude of the corresponding signal sample value with respect to other signal sample values; a decoder unit configured to receive the set of rank order values and to responsively determine symbols of a codeword; and, a control processor configured to receive the set of rank order values and to process at least two rank order values from the set of rank order values, and to generate a channel receiver control signal for at least one receive channel circuit corresponding to one of the at least two rank order values.

In at least one embodiment, the control processor generates the channel receiver control signal based on a predetermined symbol sequence. In at least one embodiment, the predetermined symbol sequence is a known pattern of symbols. In at least one embodiment, the control processor receives the predetermined symbol sequence from the decoder unit. In at least one embodiment, the control processor is configured to decode the set of rank order values into symbols of a codeword, and identify a known pattern of symbols.

In at least one embodiment, the system further comprises a memory circuit configured to store previously transmitted rank order values. In at least one embodiment, each channel receive circuit comprises an amplifier configured to receive the channel receiver control signal from the control processor and to adjust a gain and/or a DC offset of the channel receive circuit. In at least one embodiment, each channel receive circuit comprises a line equalizer configured to receive the channel receiver control signal from the control processor and to compensate for frequency-dependent channel loss.

In at least one embodiment, the system further comprises a clock-and-data recovery (CDR) phase interpolator configured to receive the channel receiver control signal from the control processor and to responsively adjust a phase of a master clock associated with the plurality of sample units.

In at least one embodiment, each channel receive circuit comprises a lane align phase interpolator configured to receive channel receiver control signal from the control processor, and to responsively adjust a sample timing of an individual sample unit associated with a respective channel receive circuit.

In at least one embodiment, the vector signaling code comprises codewords based on permutations of a basis vector [+1 +1 0 0 0 0 −1 −1].

In at least one embodiment, the set of rank order values corresponds to a full sorting. In another embodiment, set of rank order values corresponds to a partial sorting.

In at least one embodiment, the known pattern of symbols comprises a first wire and a second wire receiving a sequence from the group consisting of a [+1, +1, +1], a [0 0 0], and a [−1 −1 −1].

In at least one embodiment, the known pattern of symbols comprises a first wire and a second wire receiving a sequence from the group consisting of a [0 +1 0], a [+1 0 +1], [0 −1 0], and a [−1 0 −1].

In at least one embodiment, the known pattern of symbols comprises a first wire and a second wire receiving a sequence from the group consisting of a [+1 +1 0], a [+1 +1 −1], a [+1 0 0], a [+1 −1 −1], a [0 +1 +1], a [0 −1 −1], a [0 0 +1], a [0 0 −1], a [−1 −1 0], a [−1 −1 +1], a [−1 0 0], a [−1 +1 +1], a [+1 0 −1], and a [−1 0 +1].

In at least one embodiment in accordance with the invention, a method is carried out, the method comprising: receiving a plurality of input signals into a plurality of receive channel circuits, wherein the input signals represent symbols of a codeword of a vector signaling code, generating a set of signal sample values based on the set of input signals by a plurality of sample units, generating a set of rank order values based on the set of signal sample values by a rank-order unit, wherein the set of rank order values comprises a respective rank order value for a corresponding signal sample value, each rank order value indicative of a relative magnitude of the corresponding signal sample value with respect to other signal sample values, determining symbols of a codeword based on the set of rank order values by a decoder, and, processing at least two rank order values of the set of rank order values by a control processor, and responsively generating a channel receiver control signal for at least one receive channel circuit corresponding to one of the at least two rank order values.

In at least one embodiment, the channel receiver control signal is generated based on a predetermined symbol sequence. In at least one embodiment, the predetermined symbol sequence is a known pattern of symbols. In at least one embodiment, the method further comprises receiving the predetermined symbol sequence from the decoder.

In at least one embodiment, the method further comprises the control processor decoding the set of rank order values into symbols of a codeword, and identifying a known pattern of symbols.

In at least one embodiment, the method further comprises storing previously transmitted rank order values.

In at least one embodiment, the method further comprises adjusting a gain of a respective channel receive circuit by an amplifier associated with the respective channel receive circuit based on the channel receiver control signal.

In at least one embodiment, the method further comprises adjusting a DC offset of a respective channel receive circuit by an amplifier associated with the respective channel receive circuit based on the channel receiver control signal.

In at least one embodiment, the method further comprises compensating for frequency-dependent channel loss of a respective channel receive circuit by a line equalizer associated with the respective channel receive circuit based on the channel receiver control signal.

In at least one embodiment, the method further comprises adjusting a phase of a master clock associated with the plurality of sample units by a clock-and-data recovery (CDR) phase interpolator based on the channel receiver control signal.

In at least one embodiment, the method further comprises adjusting a sample timing of a respective channel receive circuit by a lane align phase interpolator associated with the respective channel receive circuit based on the channel receiver control signal.

In at least one embodiment, the vector signaling code comprises codewords based on a permutation vector [+1 +1 0 0 0 −1 −1].

The examples presented herein illustrate the use of vector signaling codes for point-to-point wire communications. However, this should not been seen in any way as limiting the scope of the described invention. The methods disclosed in this application are equally applicable to other network topologies and other communication media including optical and wireless communications. Thus, descriptive terms such as "voltage" or "signal level" should be considered to include equivalents in other measurement systems, such as "optical intensity", "RF modulation", etc. Similarly, examples may reference a particular vector signaling code, number of channels, or codeword size for purposes of description without implying a limitation. Any described algorithm, method, or process may be performed by a hardware circuit, programmed or hardwired finite state machine, or by software executing on a control processor.

As used herein, the term "physical signal" includes any suitable behavior and/or attribute of a physical phenomenon capable of conveying information. Physical signals may be tangible, measurable, and non-transitory.

We claim:

1. A system comprising:
a plurality of receive channel circuits, each receive channel circuit configured to receive an input signal of a set of input signals, each input signal representing a symbol of a codeword of a vector signaling code;
a plurality of sample units configured to generate a set of signal sample values based on the set of input signals;
a rank-order unit configured to provide a set of rank order values comprising a respective rank order value for each signal sample value, each rank order value indicative of a relative magnitude of the corresponding signal sample value with respect to all remaining signal sample values;
a decoder unit configured to receive the set of rank order values and to responsively determine symbols of a codeword; and,
a control processor configured to receive the set of rank order values and to process at least two rank order values from the set of rank order values, and to generate a channel receiver control signal for at least one receive channel circuit corresponding to one of the at least two rank order values.

2. The system of claim 1, wherein the control processor generates the channel receiver control signal based on a predetermined symbol sequence.

3. The system of claim 2, wherein the predetermined symbol sequence is a known pattern of symbols.

4. The system of claim 2, wherein the control processor receives the predetermined symbol sequence from the decoder unit.

5. The system of claim 1, wherein the control processor is configured to decode the set of rank order values into symbols of a codeword, and identify a known pattern of symbols.

6. The system of claim 1, further comprising a memory circuit configured to store previously transmitted rank order values.

7. The system of claim 1, wherein each channel receive circuit comprises an amplifier configured to receive the channel receiver control signal from the control processor and to adjust a gain and/or a DC offset of the channel receive circuit.

8. The system of claim 1, wherein each channel receive circuit comprises a line equalizer configured to receive the channel receiver control signal from the control processor and to compensate for frequency-dependent channel loss.

9. The system of claim 1, further comprising a clock-and-data recovery (CDR) phase interpolator configured to receive the channel receiver control signal from the control processor and to responsively adjust a phase of a master clock associated with the plurality of sample units.

10. The system of claim 1, wherein each channel receive circuit comprises a lane align phase interpolator configured to receive channel receiver control signal from the control processor, and to responsively adjust a sample timing of an individual sample unit associated with a respective channel receive circuit.

11. A method comprising:
receiving a plurality of input signals into a plurality of receive channel circuits, wherein the input signals represent symbols of a codeword of a vector signaling code;
generating a set of signal sample values based on the set of input signals by a plurality of sample units;
generating a set of rank order values based on the set of signal sample values by a rank-order unit, wherein the set of rank order values comprises a respective rank order value for a corresponding signal sample value, each rank order value indicative of a relative magnitude of the corresponding signal sample value with respect to all remaining signal sample values;
determining symbols of a codeword based on the set of rank order values by a decoder; and,
processing at least two rank order values of the set of rank order values by a control processor, and responsively generating a channel receiver control signal for at least one receive channel circuit corresponding to one of the at least two rank order values.

12. The method of claim 11, wherein the channel receiver control signal is generated based on a predetermined symbol sequence.

13. The method of claim 12 wherein the predetermined symbol sequence is a known pattern of symbols.

14. The method of claim 11, further comprising the control processor decoding the set of rank order values into symbols of a codeword, and identifying a known pattern of symbols.

15. The method of claim 11, further comprising storing previously transmitted rank order values.

16. The method of claim 11, further comprising adjusting a gain of a respective channel receive circuit by an amplifier associated with the respective channel receive circuit based on the channel receiver control signal.

17. The method of claim 11, further comprising adjusting a DC offset of a respective channel receive circuit by an amplifier associated with the respective channel receive circuit based on the channel receiver control signal.

18. The method of claim 11, further comprising compensating for frequency-dependent channel loss of a respective channel receive circuit by a line equalizer associated with the respective channel receive circuit based on the channel receiver control signal.

19. The method of claim 11, further comprising adjusting a phase of a master clock associated with the plurality of sample units by a clock-and-data recovery (CDR) phase interpolator based on the channel receiver control signal.

20. The method of claim 11, further comprising adjusting a sample timing of a respective channel receive circuit by a lane align phase interpolator associated with the respective channel receive circuit based on the channel receiver control signal.

* * * * *

UNITED STATES PATENT AND TRADEMARK OFFICE
CERTIFICATE OF CORRECTION

PATENT NO. : 9,450,744 B2  
APPLICATION NO. : 14/717717  
DATED : September 20, 2016  
INVENTOR(S) : Richard Simpson and Roger Ulrich Page 1 of 1

It is certified that error appears in the above-identified patent and that said Letters Patent is hereby corrected as shown below:

On the Title Page

Please correct as follows:
(73) Assignee: "KANDOU LAB, S.A. (CH)" to -- KANDOU LABS, S.A. (CH) --

Signed and Sealed this
Eleventh Day of July, 2017

Joseph Matal
*Performing the Functions and Duties of the*
*Under Secretary of Commerce for Intellectual Property and*
*Director of the United States Patent and Trademark Office*